United States Patent
Stella (10) Patent No.: US 8,755,188 B2
(45) Date of Patent: Jun. 17, 2014

(54) HALF-BRIDGE ELECTRONIC DEVICE WITH COMMON AUXILIARY HEAT SINK

(75) Inventor: Cristiano Gianluca Stella, San Gregorio di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/536,278

(22) Filed: Jun. 28, 2012

(65) Prior Publication Data

US 2013/0003309 A1 Jan. 3, 2013

(30) Foreign Application Priority Data

Jun. 30, 2011 (IT) .............................. MI2011A1213

(51) Int. Cl.
*H05K 7/20* (2006.01)
*H01L 29/00* (2006.01)
*H02J 3/38* (2006.01)
*H02M 1/44* (2007.01)
*H02M 7/539* (2006.01)

(52) U.S. Cl.
CPC . *H01L 29/00* (2013.01); *H02J 3/38* (2013.01); *H02M 1/44* (2013.01); *H02M 7/539* (2013.01); *Y02B 70/1483* (2013.01)
USPC ............ 361/709; 361/715; 363/132; 363/141

(58) Field of Classification Search
USPC ............................. 361/709, 715; 363/132, 141
See application file for complete search history.

(56) References Cited

U.S. PATENT DOCUMENTS

| | | | |
|---|---|---|---|
| 4,748,538 A | 5/1988 | Tsuji | |
| 5,311,395 A | 5/1994 | McGaha et al. | |
| 5,504,652 A | 4/1996 | Foster et al. | |
| 5,977,630 A | 11/1999 | Woodworth et al. | |
| 6,150,254 A | 11/2000 | Kito | |
| 6,833,997 B1 | 12/2004 | Jones, III et al. | |
| 7,145,224 B2 * | 12/2006 | Kawashima et al. | 257/678 |

(Continued)

FOREIGN PATENT DOCUMENTS

| | | | |
|---|---|---|---|
| JP | 49047567 U | 4/1974 | |
| JP | 58218149 A | 12/1983 | |

(Continued)

OTHER PUBLICATIONS

Italian Search Report and Written Opinion for IT MI2011A001213 mailed Feb. 27, 2012 (7 pages).

*Primary Examiner* — Telly Green (74) *Attorney, Agent, or Firm* — Gardere Wynne Sewell LLP (57) ABSTRACT

An electronic device includes a first and second integrated chip switch, each having a back (drain) surface and an opposite front (source) surface. An insulating package embeds the switches along with first, second and third heat sinks. The front surface of the first switch and back surface of the second switch are mounted to the first heat sink to couple first switch source to the second switch drain through the first heat sink in a half-bridge configuration. The first switch back surface is mounted to the second heat sink and the second switch front surface is mounted to the third heat sink. The package includes first, second and third openings which expose, respectively, the first, second and third heat sinks. The first heat sink opening is provided on one surface of the package, while the second and third heat sink openings are provided on an opposite surface of the package.

21 Claims, 8 Drawing Sheets

(56) References Cited

U.S. PATENT DOCUMENTS

| | | |
|---|---|---|
| 7,286,361 B2 | 10/2007 | Yamanaka |
| 7,746,650 B2 | 6/2010 | Hellinger et al. |
| 7,776,658 B2 | 8/2010 | Liu et al. |
| 7,816,784 B2 | 10/2010 | Son et al. |
| 7,851,908 B2 | 12/2010 | Otremba et al. |
| 7,892,893 B2 | 2/2011 | Obara |
| 8,062,932 B2 * | 11/2011 | Hebert et al. .......... 438/121 |
| 8,154,108 B2 | 4/2012 | Liu et al. |
| 8,358,017 B2 | 1/2013 | Tsui |
| 8,390,041 B2 * | 3/2013 | Yoshimochi .......... 257/288 |
| 8,481,368 B2 | 7/2013 | Xue et al. |
| 8,604,611 B2 | 12/2013 | Hauenstein |
| 2005/0161785 A1 * | 7/2005 | Kawashima et al. ........ 257/678 |
| 2005/0280140 A1 | 12/2005 | Corbin et al. |
| 2006/0091512 A1 | 5/2006 | Shinohara |
| 2007/0090523 A1 | 4/2007 | Otremba |
| 2007/0108564 A1 | 5/2007 | Tang et al. |
| 2007/0215996 A1 | 9/2007 | Otremba |
| 2008/0054422 A1 | 3/2008 | Koike et al. |
| 2009/0236732 A1 | 9/2009 | Yu et al. |
| 2009/0323288 A1 | 12/2009 | Bernard |
| 2010/0133674 A1 * | 6/2010 | Hebert et al. .......... 257/686 |
| 2011/0096509 A1 * | 4/2011 | Yoshimochi .......... 361/728 |
| 2013/0003305 A1 * | 1/2013 | Stella .......... 361/709 |

FOREIGN PATENT DOCUMENTS

| | | |
|---|---|---|
| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

\* cited by examiner

_HALF-BRIDGE ELECTRONIC DEVICE WITH COMMON AUXILIARY HEAT SINK_

PRIORITY CLAIM

This application claims priority from Italian Application for Patent No. MI2011A001213 filed Jun. 30, 2011, the disclosure of which is incorporated by reference.

TECHNICAL FIELD

The solution according to one or more embodiments relates to the field of electronics. More specifically, this solution relates to electronic devices.

BACKGROUND

Electronic devices are commonly used in several applications. In the particular case of power electronic devices, they are constructed so as to be able to withstand an operation power of relatively high value (for example, of the order of 100-625 W).

The electronic devices are generally integrated on chips of semiconductor material. Each chip is then housed into a proper package, which protects the chip at the same time allowing the access to its terminals. The package comprises an insulating body that embeds the chip. The insulating body exposes several leads, each one of them being connected electrically to a correspondent terminal of the chip; typically, the lead is connected to the terminal of the chip with a wire-bonding technique, wherein a conductive wire is fastened at an end thereof on the lead and at another end thereof on the terminal of the chip. The leads of the package are used to connect the same (and then the corresponding terminals of the chip) to external circuits. For this purpose, the electronic device is generally mounted on a Printed Circuit Board (PCB). For example, in the Surface-Mount Technology (SMT) the leads are provisionally attached, by means of solder pastes, to corresponding conductive tracks of the printed circuit board through a light pressure (pick and place), and they are then soldered by reflow thereon.

The power electronic devices are subject to remarkable heating during their operation (since they are affected by high currents and/or voltages, of the order of 50-1,500V and 0.1-8 A, respectively). Therefore, the package of every power electronic device is generally provided with one or more heat sinks Particularly, a main heat sink has a wide surface exposed on a surface for mounting the insulating body on the printed circuit board; the chip is fastened on the main heat sink, so as to facilitate the transfer of the heat produced by it to the outside of the package (so as to reduce the thermal resistance of the electronic device from its chip to the external atmosphere). The main heat sink may also be connected electrically to a terminal of the electronic device integrated on the chip, so as to act as a corresponding lead as well—for example, when the electronic device has a vertical structure with such terminal made on a back surface of the chip that is fastened on the heat sink (while the other terminals of the chip, made on a front surface thereof, are connected to the corresponding leads through conductive wires). In addition, an auxiliary heat sink has a wide surface exposed on a free surface of the insulating body (opposite its mounting surface); the auxiliary heat sink is mounted on the chip to increase the transfer of the heat produced by it to the outside of the package (so as to further reduce the thermal resistance of the electronic device from its chip to the external atmosphere). The auxiliary heat sink may also be connected electrically to another terminal of the electronic device integrated on the chip (made on its front surface).

A typical application of the power electronic devices is in the switching systems. A generic switching system comprises one or more pairs of power electronic switches (for example, power transistors of MOS type); every pair of power transistors is connected in a half-bridge configuration, wherein the transistors are arranged in series (in order to be connected between a reference terminal, or ground, and a power supply terminal), with a common node thereof that defines an output terminal for the connection of a load. The power transistors are turned on and turned off alternatively (with a short dead time at every switching wherein they are both off).

The power transistors are generally integrated on distinct chips (because of either technical or economic reasons), which chips are then housed in corresponding packages. Therefore, the switching system comprises a distinct package for each power transistor, which is mounted separately on the printed circuit board (which implements the desired electrical connection between the different power transistors).

However, the known structures of the switching systems are not completely satisfactory—for example, with respect to their size, to their constructive complexity, and to their thermal dissipation effectiveness.

SUMMARY

In its general terms, the solution according to one or more embodiments is based on the idea of housing each pair of transistors (or more generally electronic switches) into a single package, by exploiting the auxiliary heat sink for their electrical connection.

Particularly, one or more aspects of the solution according to specific embodiments are set out in the independent claims, with advantageous features of the same solution that are set out in the dependent claims, whose wording is herein incorporated verbatim by reference (with any advantageous feature provided with reference to a specific aspect of the solution according to an embodiment of the invention that applies mutatis mutandis to every other aspect thereof).

More specifically, an aspect of the solution according to an embodiment provides an electronic device (for example, for use in a switching system). The electronic device comprises a first electronic switch and a second electronic switch (for example, a low-side transistor and a high-side transistor of NMOS type). Each electronic switch is integrated on a chip having a back surface and a front surface opposite to each other; the chip comprises a first conduction terminal (for example, a source terminal) and a control terminal (for example, a gate terminal) of the corresponding electronic switch on the front surface, and a second conduction terminal (for example, a drain terminal) of the corresponding electronic switch on the back surface. The first electronic switch and the second electronic switch are connected in a half-bridge configuration, with the second conduction terminal of the first electronic switch connected to the first conduction terminal of the second electronic switch (for example, the drain terminal of the low-side transistor connected to the source terminal of the high-side transistor).

In the solution according to an embodiment, the electronic device comprises a common package comprising an insulating body; the insulating body has a mounting surface for mounting the package on a substrate (for example, a printed circuit board) and a free surface opposite the mounting surface; the insulating body embeds the first electronic switch and the second electronic switch. The package comprises a first main heat sink, which is embedded in the insulating body with a portion exposed therefrom on the mounting surface; the chip of the first electronic switch is mounted on the first main heat sink in correspondence to the front surface with the first conduction terminal of the first electronic switch contacting the first main heat sink (for example, with the chip of the low-side transistor turned upside down). The package comprises a second main heat sink, which is embedded in the insulating body with a portion exposed therefrom on the mounting surface; the chip of the second electronic switch is mounted on the second main heat sink in correspondence to the back surface with the second conduction terminal of the second electronic switch contacting the second main heat sink. The package comprises an auxiliary heat sink, which is embedded in the insulating body with a portion exposed therefrom on the free surface; the auxiliary heat sink is mounted on the chip of the first electronic switch and on the chip of the second electronic switch in correspondence to the back surface and to the front surface, respectively; the second conduction terminal of the first electronic switch and the first conduction terminal of the second electronic switch contact the auxiliary heat sink so as to be connected electrically therebetween through the auxiliary heat sink.

A further aspect of the solution according to an embodiment provides a switching system comprising one or more of such electronic devices.

A still further aspect of the solution according to an embodiment provides a complex system comprising one or more of such switching systems.

A different aspect of the solution according to an embodiment provides a corresponding method for producing the electronic device.

BRIEF DESCRIPTION OF THE DRAWINGS

The solution according to one or more embodiments, as well as further features and the advantages thereof, will be best understood with reference to the following detailed description, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details that may be exaggerated and/or simplified) and that, unless otherwise indicated, they are merely used to conceptually illustrate the structures and procedures described herein. Particularly.

DETAILED DESCRIPTION OF THE DRAWINGS

Figure 1:
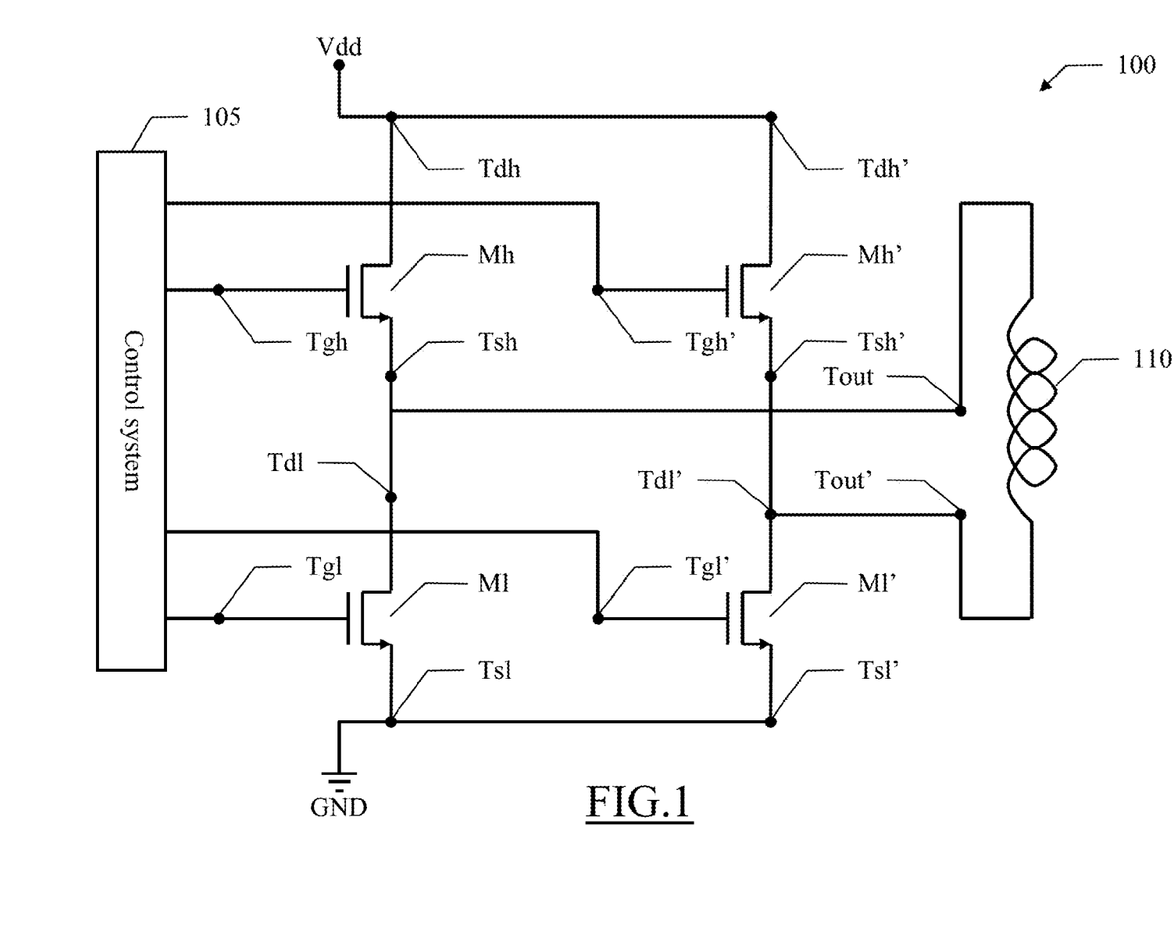
FIG. 1 shows a principle circuit scheme of a switching system wherein the solution according to an embodiment may be used.

With reference in particular to FIG. 1, a principle circuit scheme is shown of a switching system 100 wherein the solution according to an embodiment may be used.

The switching system 100 has a full-bridge structure, with two circuit branches each one formed by a low-side transistor Ml, Ml' and a high-side transistor Mh, Mh' (both of them of power NMOS type), which are connected to each other in a half-bridge configuration (with each low-side transistor Ml, Ml' equal to the corresponding high-side transistor Mh, Mh').

In each half-bridge, a source terminal Tsl, Tsl' of the low-side transistor Ml, Ml' is connected to a ground terminal GND (which receives a reference voltage, or ground), while a drain terminal Tdh, Tdh' of the high-side transistor Mh, Mh' is connected to a power-supply terminal Vdd (which receives a direct power-supply voltage—for example, 600-900V with respect to the ground voltage). A drain terminal Tdl, Tdl' of the low-side transistor Ml, Ml' and a source terminal Tsh, Tsh' of the high-side transistor Mh, Mh' are connected to each other, so as to define a corresponding output terminal Tout, Tout' of the half-bridge Ml-Mh, Ml'-Mh'.

A gate terminal Tgl, Tgh, Tgl' and Tgh' of each (low-side and high-side) transistor Ml, Mh, Ml' and Mh', respectively, is connected to a control system 105. A load 110 (for example, of inductive type) is connected between the output terminals Tout and Tout'. The control system 105 drives the transistors Ml, Mh, Ml' and Mh' so that each pair formed by the low-side transistor Ml, Ml' of a half-bridge and by the high-side transistor Mh, Mh' of the other half-bridge (i.e., Ml, Mh' and Ml', Mh) is turned on and turned off alternatively (with a short dead time at every switching wherein both the pairs of transistors Ml, Mh' and Ml', Mh are turned off to avoid any risks of cross-conduction with the creation of a short circuit between the ground terminal GND and the power-supply terminal Vdd).

Figure 2:
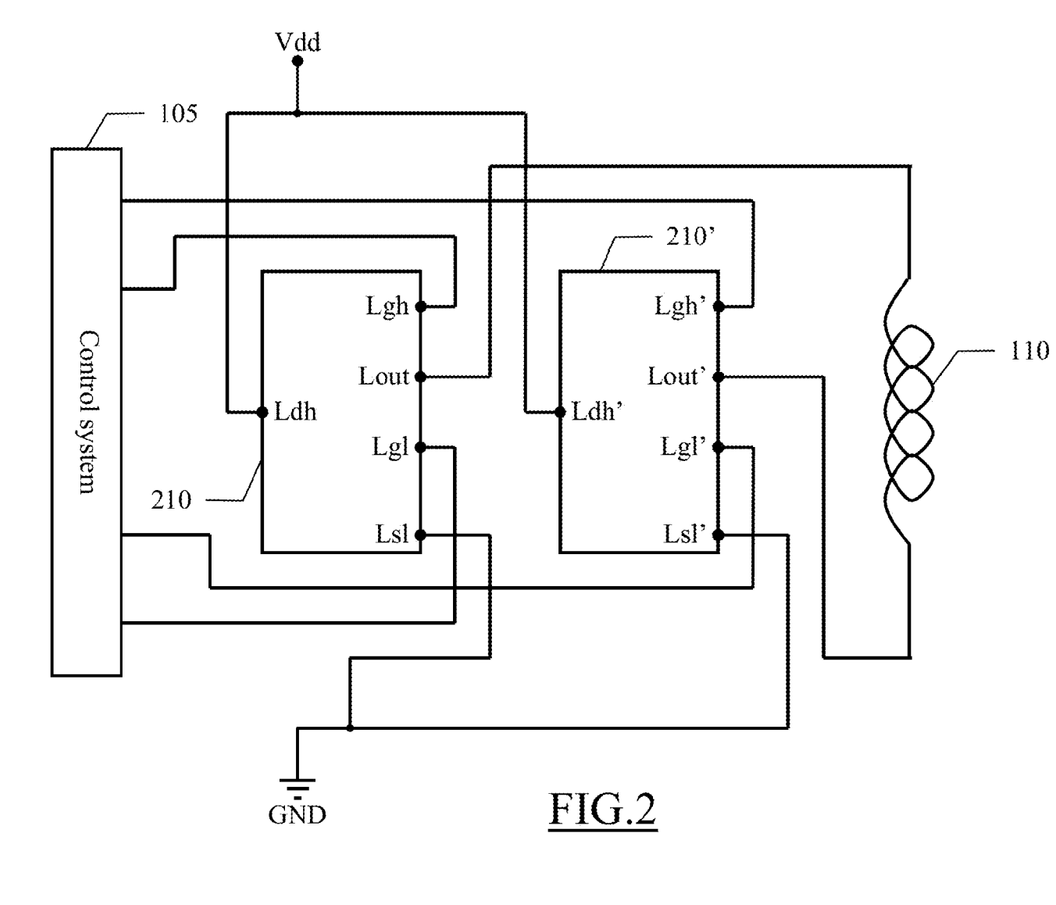
FIG. 2 shows an implementation of such switching system according to an embodiment.

An implementation of such switching system 100 according to an embodiment is shown in the FIG. 2.

In this case, in every half-bridge the low-side transistor and the high-side transistor (not shown in the figure) are made as a single electronic device 210, 210'. The electronic device 210, 210' is provided with a source lead Lsl, Lsl' (electrically connected to the source terminal of the low-side transistor), a drain lead Ldh, Ldh' (electrically connected to the drain terminal of the high-side transistor), a gate lead Lgl, Lgl' and another gate lead Lgh, Lgh' (electrically connected to the gate terminal of the low-side transistor and to the gate terminal of the high-side transistor, respectively), and an output lead Lout, Lout' (electrically connected to the output terminal of the half-bridge).

Figure 3A:
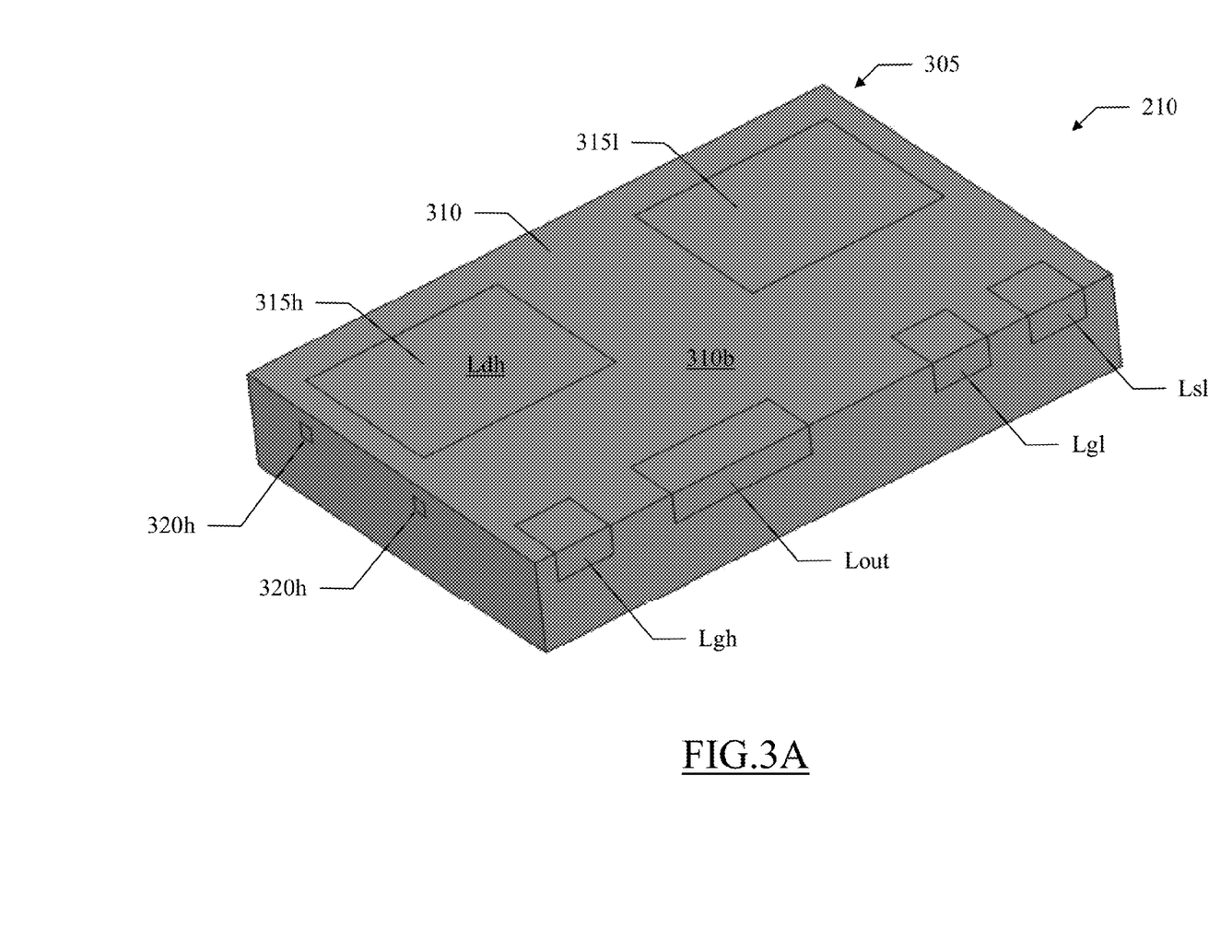
FIG. 3A-FIG. 3B show an overall schematic representation from the top and from the bottom, respectively, of an electronic device according to an embodiment that may be used in such switching system.
Figure 3B:
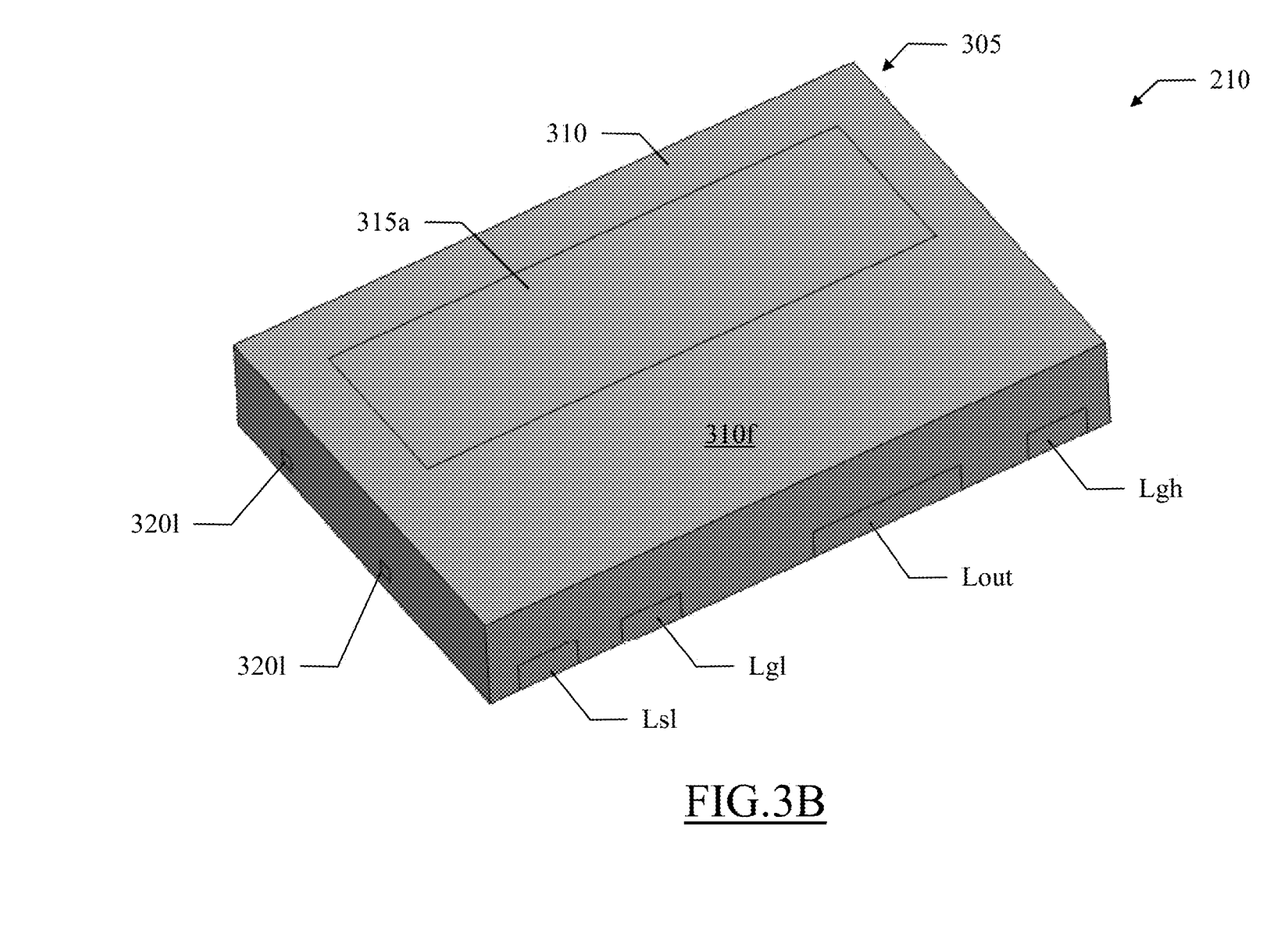

With reference now to FIG. 3A-FIG. 3B, an overall schematic representation from the top and from the bottom, respectively, is shown of an electronic device according to an embodiment that may be used in such switching system; particularly, the figures show the electronic device 210 (similar considerations apply to the other electronic device).

The electronic device 210 comprises a package 305, which protects the low-side transistor and the high-side transistor (not shown in the figure) at the same time allowing the access to their terminals. The package 305 is formed by an electrically insulating body 310 (for example, of plastic material), of generically parallelepiped shape, which embeds the low-side transistor and the high-side transistor (for example, with a width of 6-10 mm, a length of 10-20 mm, and a height of 0.8-2 mm—like 8 mm, 14.9 mm and 1 mm, respectively). The insulating body 310 exposes the leads Lsl, Ldh, Lgl, Lgh and Lout, each one of them being made of electrically conductive material (for example, of metallic material). Particularly, the leads Lsl, Lgl, Lout and Lgh are distributed uniformly along an edge of a (back) mounting surface 310b of the insulating body 310 (in front in the figure). Each lead Lsl, Lgl, Lout and Lgh is formed by a pad of generically square shape extending partially on the mounting surface 310b and partially on a side surface of the insulating body 310 adjacent thereto.

The electronic device 210 is of the Dual Side Cool (DSC) type. Particularly, the electronic device 210 comprises a (main) heat sink 315l for the low-side transistor and another (main) heat sink 315h for the high-side transistor, both of them made of thermally and electrically conductive material (for example, of metallic material). The heat sink 315l has a surface of generically rectangular shape exposed from the insulating body 310, which extends approximately over a half of the mounting surface 310b opposite the leads Lsl and Lgl (behind on the right in the figure); the exposed surface of the heat sink 315l defines a further source lead (electrically connected to the source lead Lsl). Likewise, the heat sink 315h has a surface of generically rectangular shape exposed from the insulating body 310, which extends approximately over a half of the mounting surface 310b opposite the leads Lout and Lgh (behind on the left in the figure); the exposed surface of the heat sink 315h defines the drain lead Ldh. The insulating body 310 also exposes the free ends of electrically conductive tie-bars 320l and 320h (for example, of metallic material), which are used to support the heat sink 315l and the heat sink 315h, respectively, during the making of the package 305 and are cut after the molding of the insulating body 310 (electrically connected as well to the drain lead Ldh and to the source lead Lsl, respectively); the tie-bars 320l, 320h are arranged in pairs on the other side surfaces of the insulating body 310 where the leads Lsl, Lgl, Lout and Lgh are not present (only visible on the left in the figure). The package 305 is of the SMT type—i.e., adapted to be mounted on a printed circuit board (not shown in the figure) with its mounting surface 310b rested thereon, and the leads Lsl, Ldh, Lgl and Lout soldered on corresponding conductive tracks.

As shown in the FIG. 3B, the package 305 also comprises an (auxiliary) heat sink 315a made of thermally and electrically conductive material (for example, of metallic material). The heat sink 315a has a surface of generically rectangular shape exposed from the insulating body 310, which extends over approximately a half of a (front) free surface 310f thereof, opposite the mounting surface 310b (behind in the figure)—for example, for the fastening of corresponding external radiators (not shown in the figure). As described in detail in the following, the heat sink 315a is electrically connected to the output lead Lout.

The leads Lsl, Ldh, Lgl, Lgh, Lout, the exposed surfaces of the heat sinks 315l, 315h and 315a, and the tie-bars 320l and 320h are properly spaced apart among them so as to guarantee the correct creepage distance along the insulating body 310. For example, the creepage distances are equal to 1 mm between the source lead Lsl (for example, 1 mm long) and the gate lead Lgl (for example, 1 mm long), 4 mm between the gate lead Lgl and the output lead Lout (for example, 5 mm long), 1 mm between the output lead Lout and the gate lead Lgh (for example, 1 mm long), 2.7 mm between the exposed surfaces of the heat sinks 315l and 315h, 2.7 mm between the drain lead Ldh (and the tie-bars 320h) and the leads Lout, Lgh, 2.7 mm between the heat sink 315l (i.e., its exposed surface and the tie-bars 320l) and the leads Lsl, Lgl, (even if the choice of such distance is not due to particular limitations connected to the creepage distance, but mainly to issues of symmetry between the heat sinks 315h and 315l), and 2.7 mm between the exposed surface of the heat sink 315a and the leads Lsl, Lgl, Lout, Lgh and the tie-bars 320l, 320h—even if such values are purely indicative and in no way limitative.

Figure 4A:
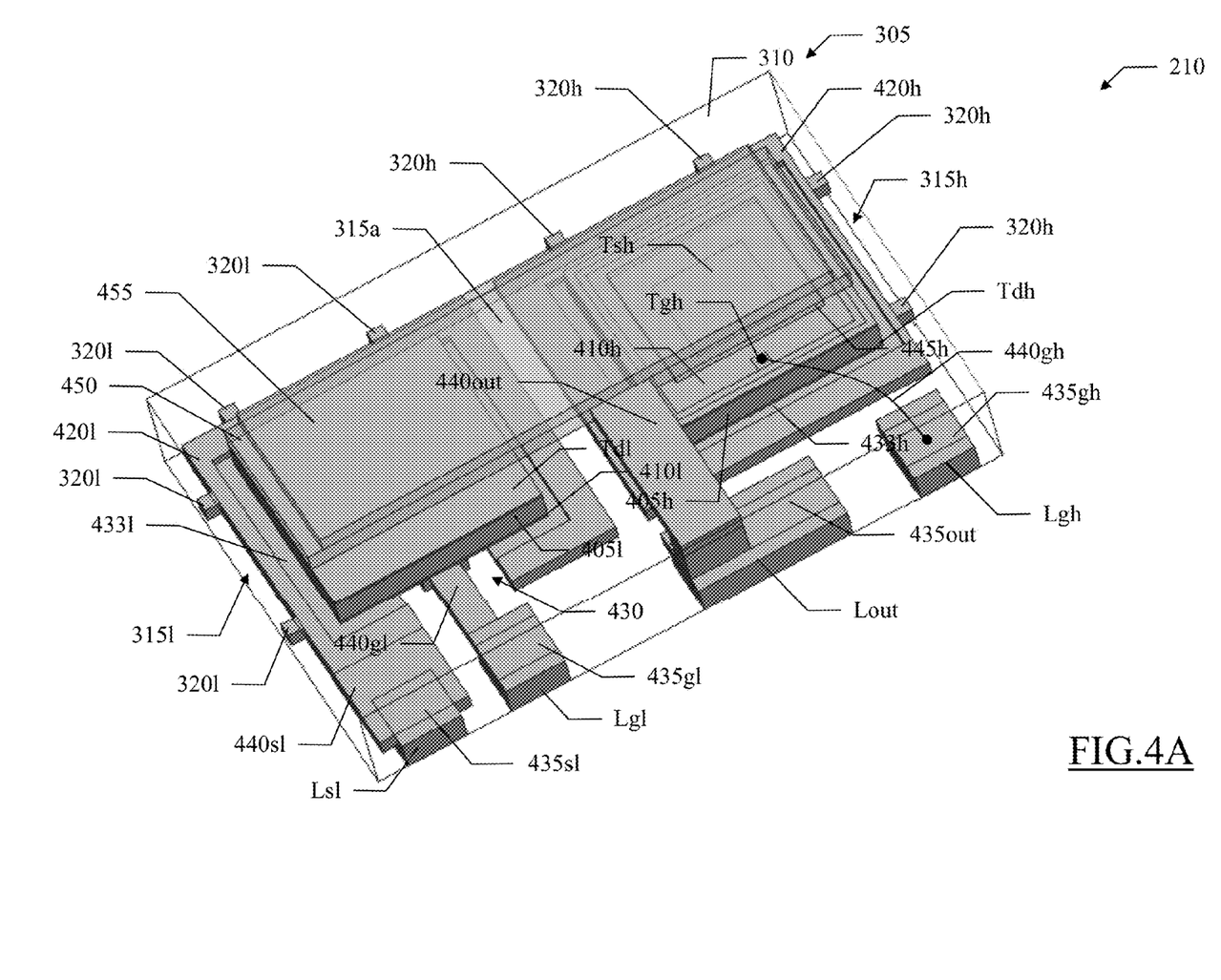
FIG. 4A-FIG. 4C show a phantom perspective view from the top, a phantom perspective view from the bottom, and a cross-section side view, respectively, of such electronic device according to an embodiment.
Figure 4B:
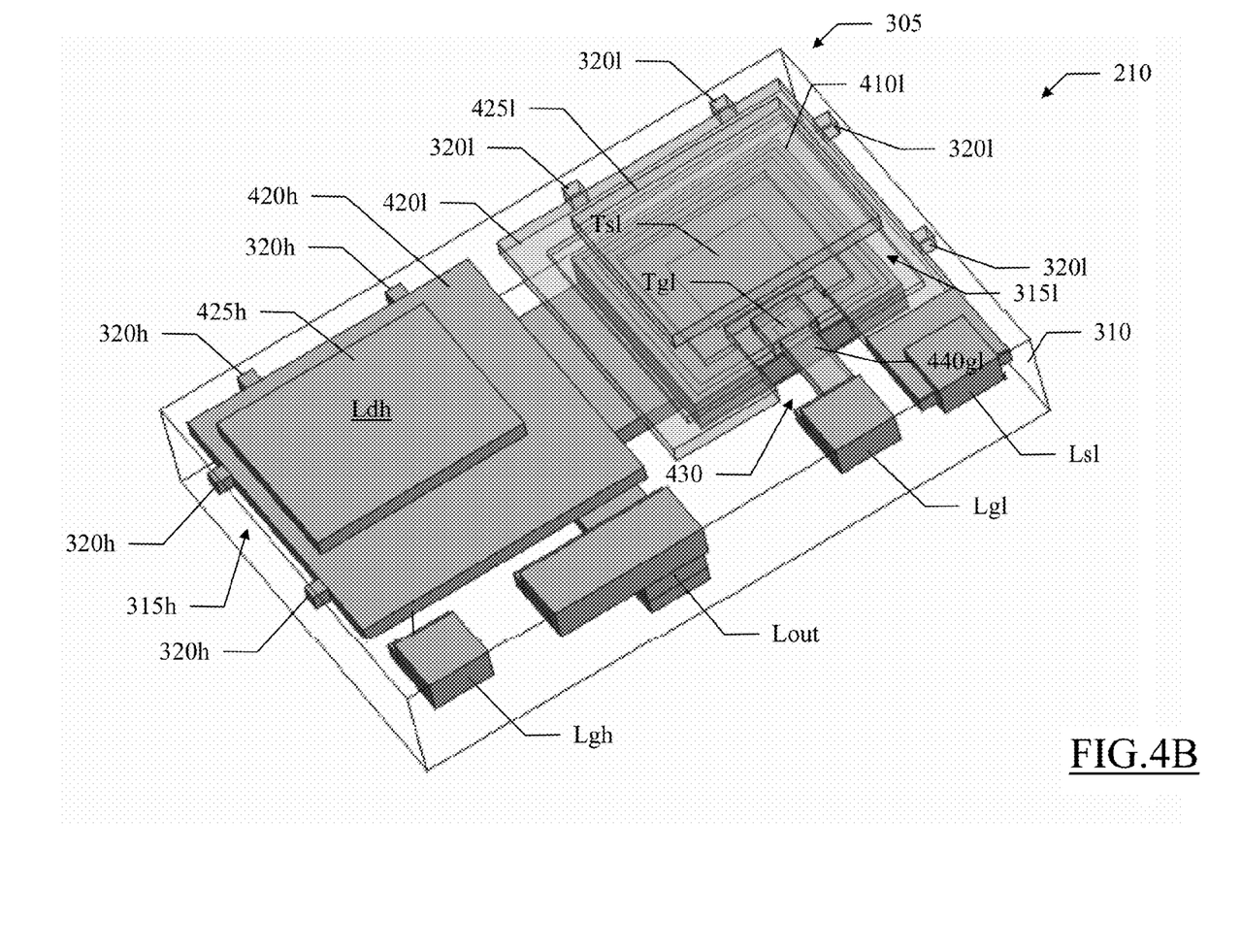
Figure 4C:
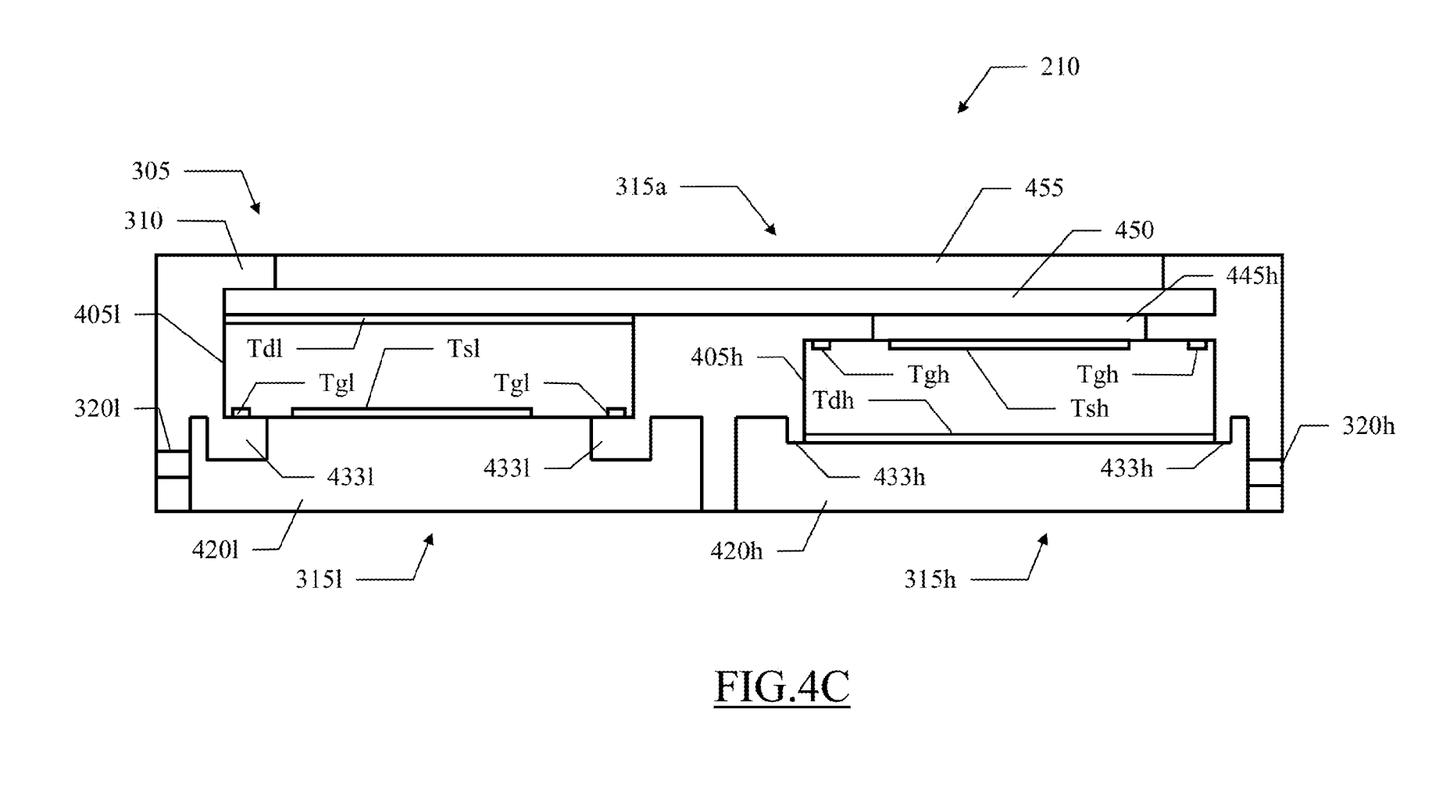

Passing to FIG. 4A-FIG. 4C, there is shown a phantom perspective view from the top, a phantom perspective view from the bottom, and a cross-section side view, respectively, of such electronic device 210 according to an embodiment.

With reference in particular to the FIG. 4A, the low-side transistor and the high-side transistor are integrated on a chip of semiconductor material 405l and 405h, respectively, on which the terminals Tsl, Tsh, Tgl, Tgh and Tdl, Tdh of the corresponding transistor are arranged—made of electrically conductive material (for example, of metallic material). Particularly, the drain terminal Tdl, Tdh extends on a whole back surface of the chip 405l, 405h. A front surface of the chip 405l, 405h (opposite its back surface) is instead covered by an insulating layer 410l, 410h. A tap defining the source terminal Tsl, Tsh and a tap defining the gate terminal Tgl, Tgh of the corresponding transistor are exposed from the insulating layer 410l, 410h on the front surface of the chip 405l, 405h. The source terminal Tsl, Tsh has a generically rectangular shape, and it is arranged approximately at the center of the front surface of the chip 405l, 405h. The gate terminal Tgl, Tgh instead comprises a frame arranged close to an edge of the front surface 405l, 405h of the chip 405l, 405h (so as to surround the source terminal Tsl, Tsh) and a connection pad expanding from such frame inwards in correspondence to the center of a segment thereof facing the leads Lsl, Lgl, Lout, Lgh.

The chip 405h is typically mounted normally on the heat sink 315h in correspondence to its back surface, so that the drain terminal Tdh is fastened thereto (for example, soldered). In the solution according to an embodiment, the chip 405l is instead mounted turned upside down on the heat sink 315l in correspondence to its front surface, so that the source terminal Tsl is fastened thereto (for example, soldered). The heat sink 315a is then mounted on both the chips 405l and 405h; particularly, the heat sink 315a is mounted on the chip 415l in correspondence to its back surface, so that the drain terminal Tdl is fastened thereto (for example, soldered), and it is mounted on the chip 415h in correspondence to its front surface, so that the source terminal Tsh is fastened thereto (for example, soldered). In this way, the drain terminal Tdl and the source terminal Tsh are electrically connected between them (and to the output lead Lout) through the heat sink 315a (which then defines a double island for both the chip 405l and the chip 405h).

The above-described structure allows housing both the low-side transistor and the high-side transistor in a single package 305, so as to obtain a very compact structure. This considerably reduces the size of the half-bridge formed by such transistors, with a corresponding size reduction of the entire switching system. Moreover, in this way the construction of the half-bridge is also simplified, with a consequent reduction of its production cost. The heat sink 315a so extended to be mounted on both the chips 405l and 405h has a wide single surface exposed from the insulating body that also improves the thermal dissipation efficiency of the electronic device 210, and then its performance.

The position of the source terminal Tsl (below near the mounting surface of the insulating body 310) allows noticeably the reducing of a stray inductance of the connection to the corresponding source lead Lsl—also thanks to the exposed surface of the heat sink 315l electrically connected to the same source lead Lsl (specular and symmetric to the drain lead Ldh). Consequently, there is remarkably increased switching speed of the low-side transistor (especially for its turning off), and then of the entire electronic device 210. This makes the electronic device 210 particularly suited to applications that demand high switching speed—for example, in DC-DC converters, inverters and lighting systems.

More in detail, the heat sink 315*l* is formed by a plate 420*l* of generically rectangular shape (slightly smaller than a half of the insulating body 310), from which the tie-bars 320*l* project laterally (leftwards and backwards in the figure). As shown in the FIG. 4B, the heat sink 315*l* also comprises a splint 425*l* that projects from the plate 420*l* downwards (on the opposite side of the chip 405*l*); the splint 425*l* extends on a prevalent part of the plate 420*l* being distal from the heat sink 315*h* and the leads Lsl, Lgl (on the right and behind in the figure). The heat sink 315*l* is completely embedded in the insulating body 310, with the exception of a free surface of its splint 425*l* defining the further source lead (so as to offer a large surface for the transfer of the heat produced by the chip 405*l* to the outside, but at the same time guaranteeing a good adhesion of the insulating body 310 to the heat sink 315*l*). The plate 420*l* has a lateral hollow 430, which extends from a longitudinal edge of the plate 420*l* facing the leads Lsl, Lgl (opposite the gate lead Lgl) up to near the splint 425*l*. A portion of the gate terminal Tgl (comprising its connection pad and a small part of its frame) is arranged in correspondence to the hollow 430, so that such portion of the gate terminal Tgl is insulated from the plate 420*l*. Moreover, returning to the FIG. 4A, a groove 433*l* is formed over the plate 420*l* (facing the chip 405*l*). The groove 433*l* has a generically rectangular shape, interrupted by the hollow 430, with an outer size larger than the largest gate terminal Tgl and the largest chip 405*l* that may be mounted on the plate 420*l* and an inner size smaller than the smallest gate terminal Tgl that may be mounted on the plate 420*l*. In this way, the groove 433*l* extends around a remaining portion of the gate terminal Tgl (comprising most of its frame), so that such portion of the gate terminal Tgl as well is insulated from the plate 420*l*. Consequently, the entire gate terminal Tgl is insulated from the heat sink 315*l* (and then from the source terminal Tsl). The above-described structure of the heat sink 315*l* (i.e., with hollow) allows maintaining the heat sink 315*l* as wide as possible (improving the thermal dissipation efficiency), nevertheless guaranteeing the correct electrical operation of the electronic device 210.

Likewise, the heat sink 315*h* is formed by a plate 420*h* of generically rectangular shape (slightly smaller than a half of the insulating body 310), from which the tie-bars 320*h* project laterally (rightwards and backwards in the figure). As shown in the FIG. 4B, the heat sink 315*h* also comprises a splint 425*h* that projects from the plate 420*h* downwards (on the opposite side of the chip 405*h*); the splint 425*h* extends on a prevalent part of the plate 420*h* being distal from the heat sink 315*l* and the leads Lout, Lgh (on the left and behind in the figure). The heat sink 315*h* is completely embedded in the insulating body 310, with the exception of a free surface of its splint 425*h* defining the drain lead Ldh (so as to offer a large surface for the transfer of the heat produced by the chip 405*h* to the outside, but at the same time guaranteeing a good adhesion of the insulating body 310 to the heat sink 315*h*). Moreover, returning to the FIG. 4A, a depression 433*h* is formed in the upper part of the plate 420*h* in front of the chip 405*h*; the depression 433*h* has a section matching the largest chip that may be mounted on the plate 420*h* (larger than the chip 405*h* in the example in issue), and a depth equal to a fraction of the height thereof (for example, 0.1-0.3 mm). A lower portion of the chip 405*h* is housed in the depression 433*h*, so that the chip 405*h* projects to a lower extent over the heat sink 315*h* (with respect to the chip 405*l* over the heat sink 315*l*).

For each one of the leads Lsl, Lgl, Lout and Lgh, the package 305 further comprises a socket 435*sl*, 435*gl*, 435out and 435*gh*, respectively, of electrically conductive material (for example, of metallic material). The socket 435*sl*, 435*gl*, 435out, 435*gh* is formed by a generically parallelepiped-shaped base, whose outer (back and side) surfaces are exposed from the insulating body 310 to define the lead Lsl, Lgl, Lout, Lgh; the socket 435*sl*, 435*gl*, 435out, 435*gh* also comprises a platform extending inwards the insulating body 310, flush with a top surface of the base (at the level of a top surface of the plates 420*l*, 420*h*).

In the case of the source lead Lsl, the plate 420*l* is extended with a cantilever 440*sl* that reaches the platform of the corresponding socket 435*sl*—all with the same thickness (so as to electrically connect the source terminal Tsl to the source lead Lsl). This further reduces the stray inductance of the connection between the source terminal Tsl and the source lead Lsl (consequently increasing the switching speed of the low-side transistor).

In the case of the gate lead Lgl, a cantilever 440*gl* of electrically conductive material (for example, of metallic material) extends from the platform of the corresponding socket 435*gl* (with the same thickness) inside the hollow 430; the cantilever 440*gl* has an enlarged free end (that defines a corresponding connection pad, even with a reduced thickness), which surrounds the connection pad of the gate terminal Tgl (sees FIG. 4B). The connection pad of the cantilever 440*gl* is directly fastened (for example, soldered) on the connection pad of the gate terminal Tgl (so as to electrically connect the gate terminal Tgl to the gate lead Lgl). This allows accessing the gate terminal Tgl in a simple and effective way (for its connection to the gate lead Lgl) even with the structure with hollow of the heat sink 315*l*.

In the case of the output lead Lout, a cantilever 440out of electrically conductive material (for example, of metallic material) extends from the heat sink 315*a* (with the same thickness) towards the corresponding socket 435out. The cantilever 440out ends with a turret turned downwards down to reach a connection pad defined by the platform of the socket 435out; the turret of the cantilever 440out is fastened (for example, soldered) on the connection pad of the socket 435out (so as to electrically connect the output terminal Tout to the output lead Lout).

In the case of the gate lead Lgh, one or more connection wires 440*gh* are fastened (for example, soldered) at an end thereof on the gate terminal Tgh and at another end thereof on a connection pad defined by the platform of the respective socket 435*gh* (so as to electrically connect the gate terminal Tgh to the gate lead Lgh).

The heat sink 315*a* is formed by a plate 445*h* of generically rectangular shape, which extends in plant over and around the source terminal Tsh up to near the gate terminal Tgh (without reaching it). A further plate 450 of generically rectangular shape bridges over the plate 445*h* and the plate 405*l*; the plate 450 projects beyond the plate 445*h* from three edges thereof (with the exception of the one at the side of the gate terminal Tgh) up to reach corresponding edges of the chip 405*h* in plant, but remaining spaced apart from an underlying portion of the gate terminal Tgh, and to cover the chip 405*l* in length entirely. The heat sink 315*a* also comprises a splint 455 extending from the plate 450 upwards (on the opposite side of the chips 405*l*, 405*h*); the splint 455 has a width substantially equal and a length slightly lower with respect to the plate 450 (which projects below it at its longitudinal ends). The heat sink 315*a* is completely embedded in the insulating body 310, with the exception of a free surface of its splint 455 (so as to offer a large surface for the transfer of the heat produced by the chips 405*l*, 405*h* to the outside, but at the same time guaranteeing a good adhesion of the insulating body 310 to the heat sink 315*a*).

As visible more clearly in the FIG. 4C, the depression 433*h* (that maintains the chip 405*h* lower than the chip 405*l*) allows obtaining a limited thickness of the entire package 305 (for example, lower than 0.9-1 mm) by maintaining unchanged the heat sink 315*a*; indeed, the thickness of the portion of the heat sink 315*a* in correspondence to the chip 405*h* should be sufficiently high to provide a good heat dissipation but guaranteeing the necessary electrical insulation from the gate terminal Tgh (and the mechanical reliability of the structure used to obtain such electrical insulation). Therefore, in this way the limited thickness of the package 305 is obtained without any negative impact on the heat sink 315*a*. The portion of the heat sink 315*a* in correspondence to the chip 405*l* should instead have a lower thickness (to compensate the higher position of the chip 405*l*); this does not constitute a problem in general, since such portion of the heat sink 315*a* has a more compact structure (since there is no need of insulating it from the drain terminal Tdl).

In order to further reduce the thickness of the package 210, it is also possible to form a further depression (not shown in the figure) in the lower part of the plate 450 in front of the chip 405*l*; the depression has a section matching the largest chip 405*l* that may be mounted on the plate 420*l*, and a depth equal to a desired increment of depth of the depression 433*h*, and therefore a desired reduction of thickness of the device 210 (for example, 0.1-0.3 mm)—with an upper portion of the chip 405*l* that is housed in such depression. The reduction of thickness of the plate 450 thus obtained also reduces the thermal resistance from the chip 405*l* to the plate 450, without reducing the thermal capacity and the mechanical strength of the entire heat sink 315*a*.

Figure 5:
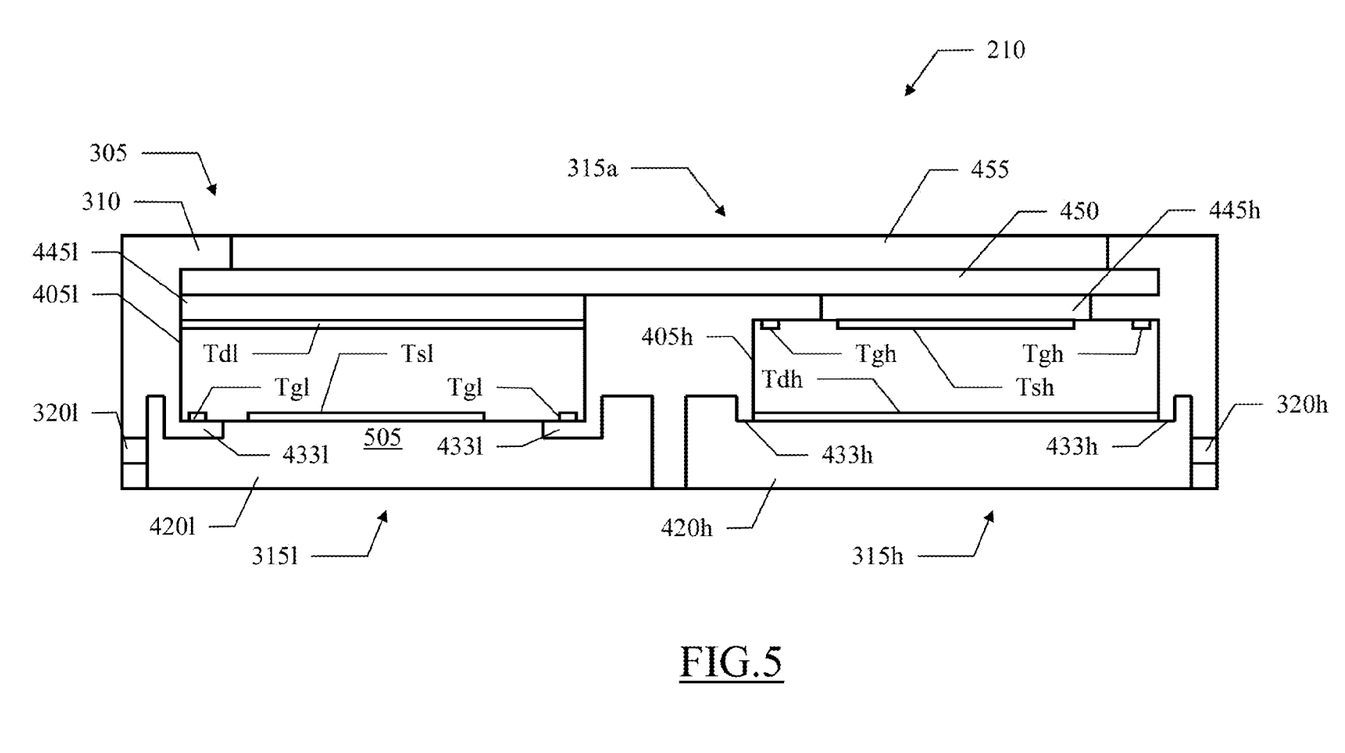
FIG. 5 shows a cross-section side view of such electronic device according to a different embodiment.

Alternatively, as shown in the partial cross-section side view of the same electronic device 210 according to a different embodiment shown in FIG. 5, a platform 505 being delimited in the plate 420*l* (of the heat sink 315*l*) by the groove 433*l* is lowered (so as to be sunken therein); particularly, the distance between an upper surface of the platform 505 and the upper surface of the plate 420*l* is equal to a depth of the depression 433*h*. In this way, the chip 405*l* (rested on the platform 505 with a lateral portion thereof that projects over the groove 433*l*) is at the same height of the chip 405*h*. In this case, the heat sink 315*l* further comprises a plate 445*l* (having the same thickness of the plate 445*h*), which fills the space left free between the chip 405*l* (lowered) and the plate 450. Therefore, the heat sink 315*a* may now have the same thickness in correspondence of both the chip 405*l* and the chip 405*h* (nevertheless maintaining limited the thickness of the insulating body 310 of the package 305).

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. Moreover, the terms include, comprise, have and contain (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variable involved), and the term a/an should be intended as one or more items (unless expressly indicated otherwise).

For example, similar considerations apply if the electronic device has a different structure or comprises equivalent components, or it has other operative characteristics. In any case, every component thereof may be separated into more elements, or two or more components may be combined together into a single element; moreover, each component may be replicated to support the execution of the corresponding operations in parallel. It is also pointed out that (unless specified otherwise) any interaction between different components generally does not need to be continuous, and it may be either direct or indirect through one or more intermediaries.

Particularly, the operative voltages and/or currents of the electronic device and its creepage distances are merely indicative; more generally, the same solution lends itself to be applied to any electronic device wherein there are required main heat sinks on the mounting surface of its insulating body to facilitate the transfer of the heat produced by the chips to the printed circuit board (or more generally, to any other substrate on which the package may be mounted) and an auxiliary heat sink on the free surface of its insulating body to further improve the transfer of the heat produced by the chips to the outside of the electronic device.

The low-side transistor and the high-side transistor may be replaced by any other equivalent element adapted to operate as an electronic switch (for example, BJT/IGBT transistors), having a first conduction terminal (for example, an emitter terminal), a control terminal (for example, a base/gate terminal) and a second conduction terminal (for example, a collector terminal). The (common) package may be of any other type and made of any other electrically insulating material (for example, of ceramic type); similar considerations apply to the shape and to the material of the main heat sinks and of the auxiliary heat sink, and to the fastening of the chips on the corresponding main heat sinks and of the auxiliary heat sink on the chips (for example, through electrically conductive adhesive).

In any case, the same solution is also applicable by turning upside down the chip of the high-side transistor (instead of the chip of the low-side transistor)—for example, in a half-bridge based on PMOS transistors wherein the source terminal of the low-side transistor is connected to the drain terminal of the high-side transistor through the auxiliary heat sink.

The same structure described above may be used in electronic devices of other type, also not of SMT type—for example, of through-hole technology type, wherein the leads project from the insulating body downwards in order to be inserted into plated through-holes of the printed circuit board from a main surface thereof and soldered to pads on an opposite surface thereof. Moreover, it is also possible to provide alternative and/or additional leads (for example, an auxiliary source lead).

The auxiliary heat sink may be connected to the output lead of the package in any other way (for example, with one or more cantilevers, wires, tapes, or any combination thereof); moreover, the possibility of using the exposed surface of the auxiliary heat sink only as output lead (for example, for its connection to the printed circuit board through a corresponding external radiator) is not excluded.

The auxiliary heat sink may have any other configuration adapted to insulate the gate terminal of the high-side transistor therefrom (for example, with a corresponding groove following its pattern); in any case, the auxiliary heat sink may also be of flat type when the gate terminal of the high-side transistor has a structure such as to be already isolated therefrom (for example, if only formed by the connection pad).

Likewise, the splint of the auxiliary heat sink as well may have any other shape and/or size (even with more distinct exposed portions).

The lateral hollow of the main heat sink for the chip of the low-side transistor may have different shape and/or size; in any case, the possibility is not excluded of making such main heat sink with a shape (for example, L-like) extending only in correspondence to the source terminal of the low-side transistor (instead leaving its gate terminal free).

In this case as well, the source terminal of the low-side transistor may be connected to the corresponding lead of the package in any other way; moreover, the source lead may extend on the mounting surface of the package up to reaching the exposed surface of the corresponding main heat sink (so as to obtain a single source lead being L-shaped).

The groove formed on the main heat sink for the chip of the low-side transistor (for insulating its gate terminal therefrom) may have any other shape and/or size (according to the pattern of the gate terminal of the low-side transistor); in any case, such groove may also be omitted when the gate terminal of the low-side transistor has a structure such as to be already insulated from the corresponding main heat sink (for example, if only formed by the connection pad).

Consequently, the platform defined by the above-mentioned groove will have a corresponding different shape and/or size; moreover, such platform may be at any other depth within the main heat sink for the chip of the low-side transistor (even different of the depth of the depression in the heat sink for the chip of the high-side transistor). In addition or in alternative, as already indicated above, it is also possible to make a depression in the auxiliary heat sink over the chip of the low-side transistor (to compensate its greater height with respect to the chip of the high-side transistor).

The depression in the main heat sink for the chip of the high-side transistor may have any other shape, size and/or depth.

In any case, nothing prevents maintaining both the chip for the low-side transistor and the chip for the high-side transistor flush with the upper surface of the corresponding main heat sinks (without any depression of the platform for the chip of the low-side transistor and without any depression for the chip of the high-side transistor)—for example, when the auxiliary heat sink is thinner, or it is acceptable a greater thickness of the package.

The above-described electronic device lends itself to be used in any other switching system (for example, of half-bridge type with a single electronic device).

Likewise, the switching system (comprising any number of such electronic devices) lends itself to be used in any other complex system—for example, a power supply, an oscillator or a power amplifier.

Similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

What is claimed is:

1. An electronic device, comprising:
   a first electronic switch and a second electronic switch, each switch integrated on a chip having a back surface and an opposite front surface, each chip comprising a first conduction terminal and a control terminal of the switch on the front surface and a second conduction terminal of the switch on the back surface, wherein the first electronic switch and the second electronic switch are connected in a half-bridge configuration with the second conduction terminal of the first electronic switch connected to the first conduction terminal of the second electronic switch;
   a common package comprising an insulating body having a mounting surface and an opposite free surface, the insulating body embedding the first electronic switch and the second electronic switch;
   a first main heat sink embedded in the insulating body with a portion exposed therefrom on the mounting surface, wherein the chip of the first electronic switch is mounted on the first main heat sink with the front surface and the first conduction terminal of the first electronic switch contacting the first main heat sink, the first main heat sink having a lateral recess with at least a portion of the control terminal of the first electronic switch arranged in correspondence to the lateral recess so as to be insulated from the first main heat sink;
   a cantilever extending inside the lateral recess to contact the control terminal of the first electronic switch;
   a second main heat sink embedded in the insulating body with a portion exposed therefrom on the mounting surface, wherein the chip of the second electronic switch is mounted on the second main heat sink with the back surface and the second conduction terminal of the second electronic switch contacting the second main heat sink; and
   an auxiliary heat sink embedded in the insulating body with a portion exposed therefrom on the free surface, wherein the chip of the first electronic switch is mounted with the back surface and the second conduction terminal of the first electronic switch contacting the auxiliary heat sink, and wherein the chip of the second electronic switch is mounted with the front surface and the first conduction terminal of the second electronic switch contacting the first main heat sink, so as to electrically connect the second conduction terminal of the first electronic switch and first conduction terminal of the second electronic switch through the auxiliary heat sink.

2. The electronic device according to claim 1, wherein the exposed portion of the first main heat sink defines a first conduction lead of the electronic device connected to the first conduction terminal of the first electronic switch and wherein the exposed portion of the second main heat sink defines a second conduction lead of the electronic device connected to the second conduction terminal of the second electronic switch.

3. The electronic device according to claim 2, wherein the package comprises a first control lead, a second control lead and an output lead of the electronic device exposed from the insulating body at least on the mounting surface, and further comprises a connection of the control terminal of the first electronic switch to the first control lead, a connection of the control terminal of the second electronic switch to the second control lead, and a connection of the auxiliary heat sink to the output lead.

4. The electronic device according to claim 3, wherein each pair of leads are spaced apart by at least a corresponding creepage distance along the insulating body.

5. The electronic device according to claim 3, wherein the first main heat sink comprises first tie-bars and the second main heat sink comprises second tie-bars exposed from a lateral surface of the insulating body between the mounting surface and the free surface, the first tie-bars and the second tie-bars being spaced apart from the auxiliary heat sink and each lead different from the first conduction lead and the second conduction lead, respectively, by at least a corresponding creepage distance along the insulating body.

6. The electronic device according to claim 3, wherein the connection of the auxiliary heat sink to the output lead comprises a conductive cantilever extending from the auxiliary heat sink and having a free end connected to the output lead.

7. The electronic device according to claim 1, wherein the auxiliary heat sink comprises a conductive plate contacting the first conduction terminal of the second electronic switch, the conductive plate being insulated from the control terminal of the second electronic switch, and a further conductive plate contacting the second conduction terminal of the first electronic switch and the conductive plate on a free surface thereof opposite the chip of the second electronic switch.

8. The electronic device according to claim 7, wherein the further conductive plate projects at least partially beyond the conductive plate spaced apart from a corresponding portion of the control terminal of the second electronic switch.

9. The electronic device according to claim 7, wherein the auxiliary heat sink comprises a splint projecting from the further conductive plate and overlapping at least part of the first chip and at least part of the second chip, the splint having a free surface opposite the further conductive plate being exposed from the insulating body.

10. The electronic device according to claim 3, wherein the connection of the control terminal of the first electronic switch to the first control lead comprises said cantilever, the cantilever comprising a further conductive cantilever extending from the first control lead inside the lateral recess and having a free end connected to the control terminal of the first electronic switch.

11. The electronic device according to claim 10, wherein the first main heat sink comprises a groove in correspondence to at least a further portion of the control terminal of the first electronic switch for insulating said further portion of the control terminal of the first electronic switch from the first main heat sink.

12. The electronic device according to claim 11, wherein a portion of the first main heat sink delimited by the groove defines a platform sunken into the first main heat sink, the chip of the first electronic switch resting on the platform with a portion projecting over the groove.

13. The electronic device according to claim 1, wherein the second main heat sink comprises a depression housing a portion of the chip of the second electronic switch extending from the back surface thereof.

14. An electronic device, comprising:
a first integrated circuit MOSFET switch chip having a front surface defining a first source terminal and a rear surface defining a first drain terminal;
a second integrated circuit MOSFET switch chip having a front surface defining a second source terminal and a rear surface defining a second drain terminal;
a first conductive heat sink plate, wherein the first integrated circuit MOSFET switch chip is mounted with its front surface in contact with a surface of the first conductive heat sink plate and the second integrated circuit MOSFET switch chip is mounted with its rear surface in contact with the surface of the first conductive heat sink plate, said conductive heat sink plate electrically connecting the first source terminal to the second drain terminal;
a second conductive heat sink plate, wherein the first integrated circuit MOSFET switch chip is mounted with its rear surface in contact with a surface of the second conductive heat sink plate;
a third conductive heat sink plate having a laterally extending hollow aligned with a gate terminal on the front surface of the second integrated circuit MOSFET switch chip, wherein the second integrated circuit MOSFET switch chip is mounted with its front surface in contact with a surface of the third conductive heat sink plate; and
a package which embeds the first integrated circuit MOSFET switch chip, the second integrated circuit MOSFET switch chip, and the first, second and third conductive heat sink plates.

15. The device of claim 14, wherein the package includes a first opening exposing a surface portion of the first conductive heat sink plate, a second opening exposing a surface portion of the second conductive heat sink plate; and a third opening exposing a surface portion of the third conductive heat sink plate.

16. The device of claim 14, further comprising a gate lead extending through the laterally extending hollow to make electrical contact to gate terminal on the front surface of a third integrated circuit MOSFET switch chip.

17. The device of claim 16, wherein the third conductive heat sink plate includes a groove in correspondence to at least a further portion of the gate terminal for insulating said further portion of the gate terminal from the heat sink.

18. The device of claim 17, wherein a portion of the heat sink delimited by the groove defines a platform sunken into the heat sink, the second integrated circuit MOSFET switch chip resting on the platform with a portion projecting over the groove.

19. An electronic device, comprising:
a first switch having a first front surface including a first conduction terminal and a control terminal of the first switch and an opposite first back surface including a second conduction terminal of the first switch;
a second electronic switch having a second front surface including a first conduction terminal and a control terminal of the second switch and an opposite second back surface including a second conduction terminal of the second switch;
a first heat sink having a first mounting surface, wherein the first front surface of the first switch is mounted to the first mounting surface and the second back surface of the second switch is mounted to the first mounting surface, said heat sink electrically connecting the first conduction terminal of the first switch to the second conduction terminal of the second switch in a half-bridge configuration;
a second heat sink having a second mounting surface, wherein the first back surface of the first switch is mounted to the second mounting surface;
a third heat sink having a third mounting surface and a laterally extending hollow aligned with the control terminal of the second switch, and further comprising a control lead extending through the laterally extending hollow to make electrical contact to control terminal of the second switch, wherein the second front surface of the second switch is mounted to the third mounting surface; and
a common package for the first and second switches comprising an insulating body embedding the first switch, second switch and the first, second and third heat sinks.

20. The electronic device of claim 19, wherein the common package includes a first opening exposing a surface of the first heat sink opposite the first mounting surface, a second opening exposing a surface of the second heat sink opposite the second mounting surface, and a third opening exposing a surface of the third heat sink opposite the third mounting surface.

21. The electronic device of claim 20, wherein the package as opposed first and second surfaces, and wherein the first opening is present on the first surface of the package and the second and third openings are present on the second surface of the package.

* * * * *

UNITED STATES PATENT AND TRADEMARK OFFICE
CERTIFICATE OF CORRECTION

| | | |
|---|---|---|
| PATENT NO. | : 8,755,188 B2 | Page 1 of 1 |
| APPLICATION NO. | : 13/536278 | |
| DATED | : June 17, 2014 | |
| INVENTOR(S) | : Cristiano Gianluca Stella | |

It is certified that error appears in the above-identified patent and that said Letters Patent is hereby corrected as shown below:

In the Specification

At column 6, line number 12, please replace the number [4101] with the alpha-numeric -- 410$l$ --.

At column 6, line number 15, please replace the number [4101] with the alpha-numeric -- 410$l$ --.

Signed and Sealed this
Nineteenth Day of August, 2014

Michelle K. Lee
*Deputy Director of the United States Patent and Trademark Office*